(12) United States Patent
Van Dau et al.

(10) Patent No.: US 6,191,581 B1
(45) Date of Patent: Feb. 20, 2001

(54) PLANAR THIN-FILM MAGNETIC FIELD SENSOR FOR DETERMINING DIRECTIONAL MAGNETIC FIELDS

(75) Inventors: Frédéric Nguyen Van Dau, Paris; Alain Schuhl; François Montaigne, both of Palaiseau, all of (FR)

(73) Assignee: Thomson-CSF, Paris (FR)

( * ) Notice: Under 35 U.S.C. 154(b), the term of this patent shall be extended for 0 days.

(21) Appl. No.: 09/147,473

(22) PCT Filed: Jul. 4, 1997

(86) PCT No.: PCT/FR97/01205
§ 371 Date: Jan. 5, 1999
§ 102(e) Date: Jan. 5, 1999

(87) PCT Pub. No.: WO98/01764
PCT Pub. Date: Jan. 15, 1998

(30) Foreign Application Priority Data

Jul. 5, 1996 (FR) .................................................. 96 08395

(51) Int. Cl.$^7$ ............................ G01R 33/02; G01R 33/09
(52) U.S. Cl. ............................ 324/249; 324/251; 324/252
(58) Field of Search ................................. 324/207.21, 252, 324/251, 249; 360/113; 338/32 R, 32 H; 33/355 R

(56) References Cited

U.S. PATENT DOCUMENTS 4,987,509 * 1/1991 Hardayal et al ..................... 360/113

FOREIGN PATENT DOCUMENTS

| 0348027 | * | 12/1989 | (EP) . |
| 0660128 | * | 6/1995 | (EP) . |
| 57-021883 | * | 5/1982 | (JP) . |

* cited by examiner

Primary Examiner—Jay Patidar
(74) Attorney, Agent, or Firm—Oblon, Spivak, McClelland, Maier & Neustadt, P.C.

(57) ABSTRACT

A magnetic field sensor which includes a planar thin-film element made of a crystalline magnetoresistive material exhibiting resistivity anisotropy in a plane, having a first and a second easy axis of magnetization. The planar thin-film element has electrical connections allowing a first electrical measurement current to flow through the planar thin-film element in a first direction, as well as two other electrical connections allowing a voltage to be measured in a second direction transverse to the first direction. The two easy axes of magnetization have comparable magnetization values. The sensor includes an electrical conductor placed parallel to the first easy axis of magnetization, insulated from the magnetoresistive material, and allowing an electrical control current to flow, in which the control current induces, in the planar thin-film element, a magnetic field which imposes, when the sensor is not in use, an orientation of the direction of magnetization of the element parallel to the second easy axis of magnetization.

15 Claims, 3 Drawing Sheets

PLANAR THIN-FILM MAGNETIC FIELD SENSOR FOR DETERMINING DIRECTIONAL MAGNETIC FIELDS

BACKGROUND OF THE INVENTION

1. Field of the Invention

The invention relates to a thin-film magnetic field sensor.

2. Discussion of the Background

The production of a reliable magnetic sensor in the $10^{-6}$–$10^{-1}$ oersted magnetic field range remains a strategic objective, both for the detection of magnetic anomalies and for producing read heads for reading high-density magnetic storage media.

Among the physical effects that are sensitive to the magnetic field, magneto-transport phenomena have the advantage of being able to be easily integrated into the read electronics. At the present time, two types of effect are used: on the one hand, the magneto-resistance of magnetic materials and, on the other hand, the Hall effect.

French Patent Application No. 93/15551 describes a sensor for detecting a low magnetic field, based on a planar photosensitive Hall-effect element. This patent application may serve as the basis of the closest prior art. U.S. Pat. No. 4,987,509 describes a system comprising two magnetoresistive elements placed so as to be parallel to each other and a conductor placed between these two elements in order to induce a polarization field and to determine, when not in use, a direction of the magnetization in each element.

Such a sensor relies on the transverse measurement of the anisotropic magnetoresistance effect in a thin ferromagnetic film. FIG. 1 shows the magneto-sensitive layer. A current I flows in a direction XX' of the layer and the resistivity is measured in the direction YY'. This resistivity varies with the magnetization M applied to the sensor. In addition, it depends on the angle θ between the magnetization and the direction XX' of the current:

$$\rho = \frac{\Delta \rho}{2} \sin 2\theta$$

The voltage measured in the YY' direction varies with the angle θ between the magnetization of the film and the measurement current, according to the equation below:

$$V = I \frac{\Delta R}{2} \sin 5(2\theta)$$

where ΔR is the resistivity anisotropy, which depends essentially on the material and on the thickness of the active part of the sensor.

The two main advantages of planar Hall-effect sensors over longitudinal-measurement magnetoresistive sensors are, on the one hand, a great simplification in the associated technology and, on the other hand, a reduction by approximately four orders of magnitude in the thermal drift, the main noise component at low frequencies (around 1 Hz). By construction, this sensor may be made sensitive only to the magnetic field component perpendicular to its direction of supply. Its size may be reduced to dimensions smaller than those of the magnetic domains, thereby eliminating the source of noise associated with the movements of the walls. Measurements on prototypes of such sensors have shown that these sensors have a linear response over four orders of magnitude (see document A. Schuhl, F. Nguyen-Van-Dau and J. R. Childress, Applied Physics Letters, 66, May 15, 1995).

However, in cases in which the two easy axes of magnetization of the magnetoresistive layer of the sensor are equivalent (that is to say have equivalent values) a problem arises in determining the situation when the sensor is not in use.

SUMMARY OF THE INVENTION

The invention allows this doubt to be dispelled.

The invention therefore relates to a magnetic field sensor comprising a first planar thin-film element made of a crystalline magnetoresistive material exhibiting resistivity anisotropy in the plane, having a first and a second easy axis of magnetization, this element having means of electrical connections allowing a first electrical measurement current to flow through the element in a first direction, as well as two electrical connections allowing the voltage to be measured in a second direction transverse to the first direction, characterized in that the two easy axes of magnetizations are of more or less equivalent values and in that it includes a first electrical conductor placed so as to be parallel to an easy axis of magnetization, insulated from the magnetoresistive material and allowing an electrical control current to flow, which control current induces, in the element, a magnetic field which imposes, when the sensor is not in use, an orientation of the direction of magnetization of the element parallel to the second easy axis of magnetization.

In addition, experimentally such planar Hall-effect sensors have a non-zero zero-field resistance.

There may be two reasons for this offset:

defects in the definition of the geometry of the sensor, making it asymmetrical;

poor alignment of the pattern with respect to the crystal axes of the active layer.

The presence of this offset introduces an isotropic component in the transverse resistivity which drifts with temperature, thereby losing one of the essential advantages of the transverse geometry. Moreover, the output signal is then high, which limits the performance of the sensor, particularly for reading in synchronous detection mode. The proposed invention solves this problem.

Another problem is the production of biaxial compasses. To do this, provision is made to assemble two planar Hall-effect sensors in the same plane. However, this assembly must meet particular conditions.

This is why the invention also relates to an embodiment according to the invention of a sensor characterized in that it comprises:

a second element made of a magnetoresistive material similar to the first element, the two easy axes of magnetization of which are parallel to those of the first element;

means of electrical connections allowing a second electrical measurement current to flow through this second element in a direction parallel to the first direction or to the second direction;

two electrical connections allowing the voltage to be measured in a direction transverse to the direction of flow of the second current and parallel to the second direction or to the first direction;

a second electrical conductor placed so as to be parallel to the second easy axis of magnetization and allowing an electrical control current to flow, which control current induces, in this second element, a magnetic field which imposes, when the sensor is not in use, an orientation of the direction of magnetization of the element parallel to the first easy axis of magnetization.

Each of the two detectors is then sensitive to one component of the magnetic field. It may be seen that the accuracy of such a biaxial sensor will certainly be limited by the accuracy with which the two detectors are assembled.

Moreover, the two components of the magnetic field are measured by two detectors which have been assembled. The measurement accuracy is then limited by the difference in sensitivity between the two sensors. In the case of bulk manufacture, large-diameter substrates will be used. Large differences between the sensitivities of the various sensors may therefore be expected. To solve this problem, it is either necessary to tag the sensors, in order to assemble two neighbouring sensors, or to measure the sensitivity of each sensor. In both cases, this requires lengthy operations and the effect of them will be felt in the cost of the sensor.

According to the invention, provision is therefore made for the two sensors to be made in the same magnetoresistive layer and to be a short distance apart.

BRIEF DESCRIPTION OF THE DRAWINGS

The various objects and features of the invention will becomes more clearly apparent in the following description and in the appended figures which show.

DESCRIPTION OF THE PREFERRED EMBODIMENTS

Figure 1:
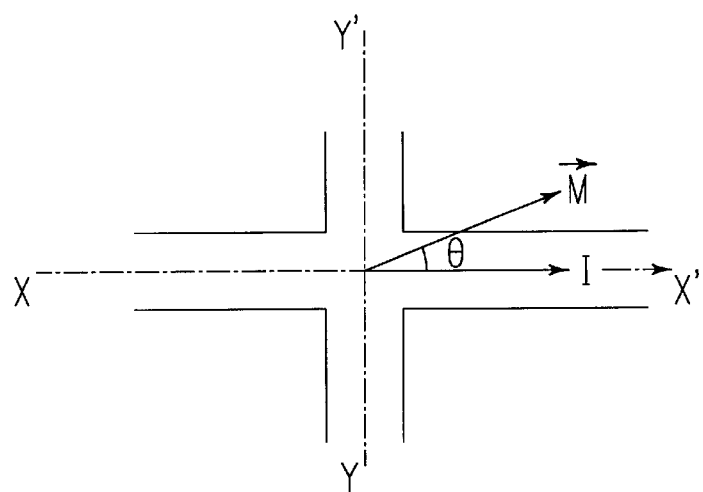
FIG. 1, a planar Hall-effect magnetoresistive sensor already described previously.

A simplified embodiment of a sensor according to the invention will be described with reference to FIG. 2.

A substrate S bears an element 1 which is preferably square but which may be rectangular and has a thin layer of a magnetoresistive material allowing a planar Hall effect to be obtained. This material exhibits an anisotropy oriented in the plane of the layer such that there are two easy axes of magnetizations. These two axes of magnetizations are oriented along directions of perpendicular axes XX' and YY'. By way of example, the thickness of the layer is between 0.01 and 1 $\mu$m (for example, 0.02 $\mu$m) and the width and the length of the element 1 are between 10 and 50 $\mu$m (for example, 20 $\mu$m). The element 1 has, at its two ends in the direction of the XX' axis, connection pads 2, 2' allowing a current supply apparatus to be connected and allowing a measurement current i to flow in the element 1. This current i is preferably a DC and constant current.

Two connection elements 3 and 3' are connected on each side of the element 1 in the direction of the YY' axis.

These connection elements allow a voltage or resistivity measurement apparatus to be connected. The connection pads 2, 2' and 3, 3' make up at least the width of one side of the element 1. In addition, the width of these connection pads rapidly increases in order to reduce the limitations associated with Johnson noise as well as the electrical dissipation. These connections may be made in a material other than that of the element 1.

A conductor 6 is provided on top of the element 1. For example, this conductor is parallel to the XX' axis. It is separated from the element 1 by an insulating layer 4.

An electrical current (DC or AC) flowing in the conductor 6 generates a transverse magnetic field in the element 1.

It is also possible to control the direction and sense of the magnetization perpendicular to the wire. The field needed to carry out this control is much less than the anisotropy field and much greater than the range of field that it is desired to detect.

The element 1 is made in the form of a thin layer of a ferromagnetic material having a cubic crystal structure and causing a quadratic magneto-crystalline anisotropy in the plane of the layers. A thin film made in such a material thus has, in its plane, two easy axes of magnetizations which are of values equivalent and perpendicular to each other. Current techniques allow such a film to be produced.

In a planar Hall-effect sensor according to the invention, the active region is such that it has the shape of a square whose characteristic size (of the order of about ten micromeeres) is small enough for the element to be practically a magnetic monodomain. Thus, in the absence of an applied magnetic field, the magnetization in the square is oriented along one of the equivalent directions of easy magnetization. When the sensor is subjected to a magnetic field substantially less than its anisotropy, it is only sensitive to the component of this field in its plane perpendicular to the direction of the magnetization. In order to control the direction of the applied field to which the sensor will be sensitive, it is therefore necessary to control the direction of the magnetization in the sensitive element. This is why, according to the invention, the conductor 6 is provided and why the electrical current (AC or DC) flows in this conductor.

This current generates a transverse magnetic field in the element 1.

It is advantageous to be in a situation in which the conductor is wide compared with the distance separating it from the sensor, the induced magnetic field then no longer depending on this distance.

Figure 2:
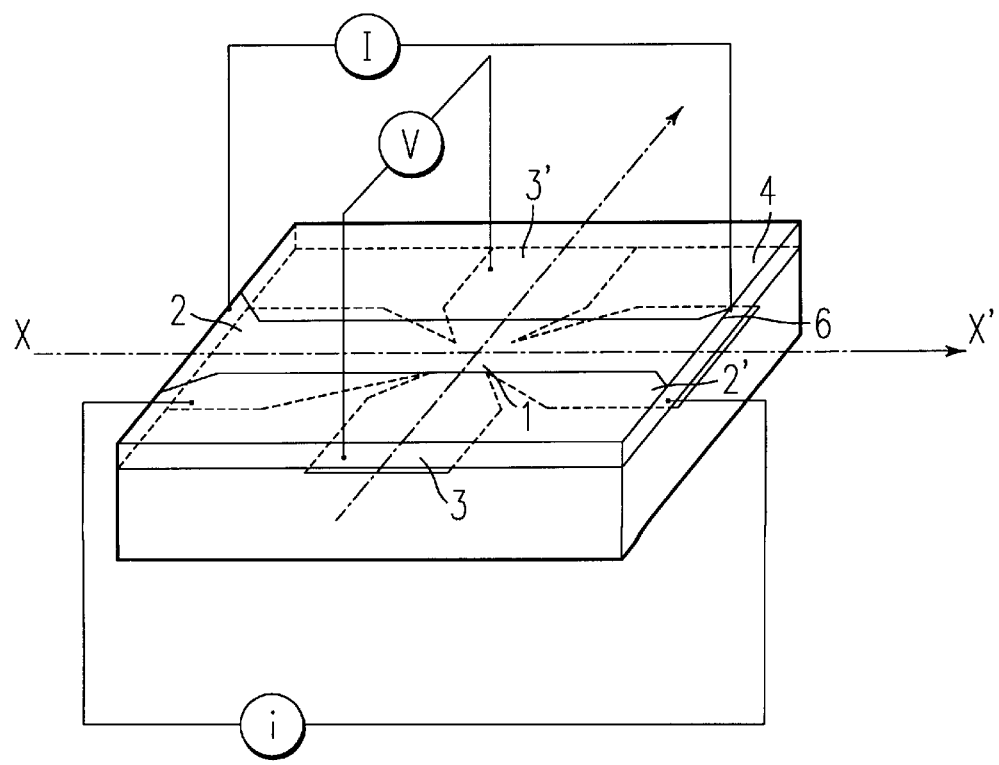
FIG. 2, a simplified embodiment of a sensor according to the invention.

According to the embodiment in FIG. 2, the conductor lies on top of the sensor, for example parallel to the XX' direction. The dimensions of the wire and its distance from the sensor must be such that they allow a magnetic field to be induced in the sensor which is sufficient to saturate the magnetization in the direction parallel to the current leads. The sense of the magnetization is controlled by the sense of the current flowing in the wire.

After having made an electrical control current +I flow in the conductor 6, the direction and sense of the magnetization are controlled and the sensor delivers a voltage V+:

$$V+ = V_0 + S.i.H \tag{1}$$

where $V_0$ is the offset voltage, S is the sensitivity of the Volt/Tesla.Ampére sensor, i is the electrical measurement current in the sensor and H is the component of the external field parallel to the voltage connections.

It is then unnecessary to have the use of an active material exhibiting a planar uniaxial anisotropy. It is therefore possible, using active layers having only their intrinsic quadratic anisotropy, and therefore two directions of easy magnetization which are equivalent and perpendicular to each other, to manufacture, on the same substrate, planar Hall-effect sensors which measure different components of the magnetic field. The sensitive direction of each magnetoresistive element is controlled by means of the control conductor (6) and the flow of a suitable current in the latter.

The field measurement may be made either after the pulse I which places the magnetization of the sensors in the correct direction or, if necessary, during the pulse. In the latter case, the sensitivity of the sensor will depend on the intensity of the current flowing in the conductor 6.

In such a type of sensor, any possible source of uniaxial anisotropy should then be eliminated. In particular, the pattern of the sensor must comply with the symmetry of the crystal.

If a current −I is now applied, the magnetization is saturated in the opposite sense to previously. The sensor then delivers the signal:

$$V_-=V_0-S*i*H \qquad (2)$$

A simple subtraction operation—V+−V−=2*S*i*H—then makes it possible to eliminate the offset and to extract the useful part of the signal.

Figure 3:
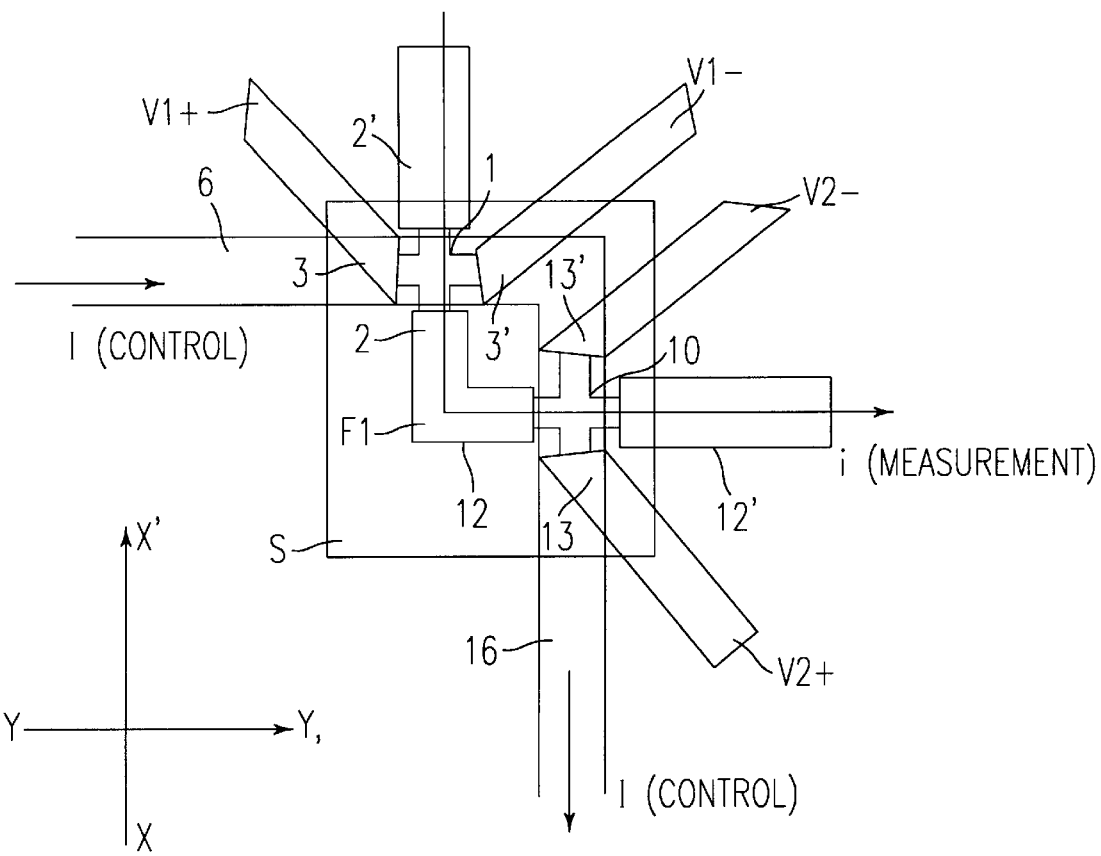
FIG. 3, a biaxial compass according to the invention.

FIG. 3 shows an application of the sensor in FIG. 2 to the production of a biaxial compass.

According to the invention, at least two sensors allowing different components of the magnetic field to be measured are produced on the same substrate.

Preferably, these are two orthogonal components. The direction of the magnetization, and therefore the direction sensitive to the field in each sensor, is controlled by a control conductor such as the conductor 6 in FIG. 2.

FIG. 3 shows two magnetoresistive elements 1 and 10 on the same substrate.

The electrodes 2 and 2' of the element 1 are aligned in an XX' direction of an axis of easy magnetization XX' of the element 1. The electrodes 3 and 3' are aligned in the direction of the other axis of easy magnetization YY'.

In the case of the element 10, the electrodes 12, 12' are aligned in the direction of the YY' axis and the electrodes 13, 13' are aligned in the direction of the XX' axis.

Voltage measurement devices are connected to the electrodes 3, 3', on the one hand, and to the electrodes 13, 13', on the other hand.

A conductor 6, parallel to the YY' axis, lies on top of the element 1 and a conductor 16, parallel to the XX' axis, lies on top of the element 10. These conductors are insulated from the elements 1 and 10. They are supplied with a control current I. According to the example in FIG. 1, the conductors 6 and 16 are the same conductor supplied with a current I.

In order to operate as a magnetic field direction detector (for example, a compass), it allows two components of a magnetic field to be measured. The two sensors 1 and 10 must be controlled by currents flowing through the orthogonal conductors 6 and 16 so that, due to the effect of the control current I, the magnetizations of the two sensors are orthogonal. The two sensors are therefore sensitive to two orthogonal components of the magnetic field.

The elements 1 and 10 will be produced on a substrate S by photolithography and/or ion etching. Next, an insulating layer 4 is deposited on the two sensors.

The highly conductive metal wires (gold, silver, copper, aluminium, etc.), which allow the direction and the sense of the magnetization in each sensor to be controlled, may be produced either on the insulating layer or on the rear face of the substrate. As may be seen in FIG. 3, the conductors 6 and 16 corresponding to each of the two sensors are orthogonal to each other. Thus, the magnetizations of each of the two sensors are orthogonal.

In the example shown in FIG. 3, the same current i flows through the sensors. Connection may be made by a connection wire Fl made of a material which is a good electrical conductor and is preferably non-magnetic (gold, silver, copper, aluminium, etc.) produced during a lithography step.

Figure 4:
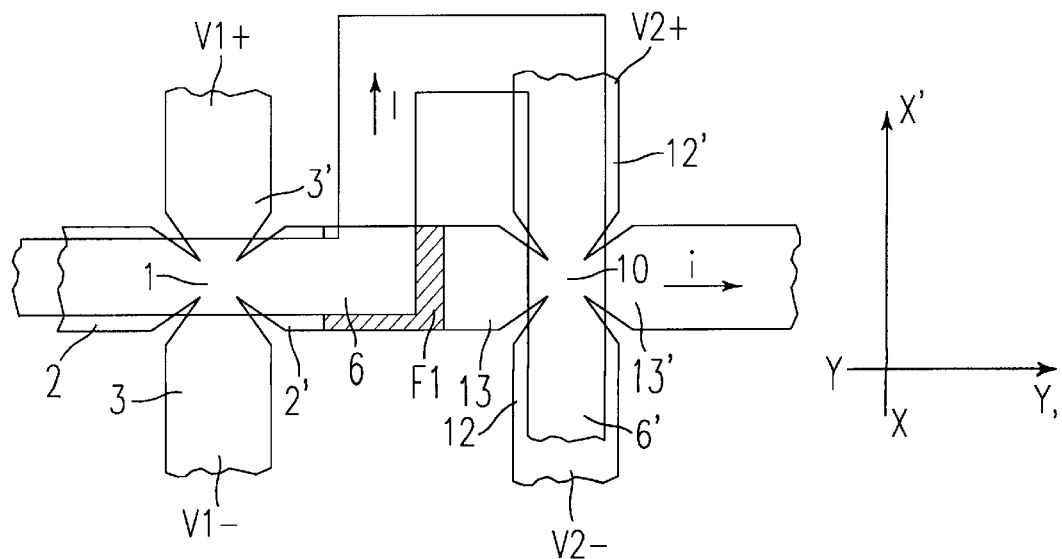
FIG. 4, an alternative embodiment of a sensor according to the invention.

FIG. 4 shows another embodiment of the sensor of the invention. The two magnetoresistive elements 1, 10 are supplied with current in the same direction YY'. According to FIG. 4, they are connected in series by the connection F1 and the same current i flows through them in the same direction. The voltage measurements at the connections 3, 3' and 13, 13' are made in directions parallel to XX'. However, what is important within the context of the invention, and what is common to the two embodiments in FIGS. 3 and 4, is that the conductors 6 and 16, on top of the elements 1 and 10, are in one case parallel to XX' and in the other to YY' (chat is to say they are mutually perpendicular).

Let us remind the reader that it was mentioned at the start of the description that these directions XX' and YY' are parallel to the easy axes of magnetization of the elements 1 and 10.

Under these conditions, the conductors 6 and 16 will induce mutually perpendicular fields in the elements 1 and 10, each field being parallel to an easy axis of magnetization.

Monolithic integration of a biaxial compass has thus been achieved. If the substrate is a semiconductor (for example Si), it is possible to monolithically integrate all or part of the electronics for reading the compass on the same substrate.

In the device in FIG. 3, the way the conductors 6 and 16 are positioned with respect to the sensors makes it possible to use the method of eliminating the offset that was described in relation to FIG. 2. In addition, the production process described above, in which the two sensors are produced during the same masking step, allows the accuracy with regard to their relative positions to be substantially improved. Thus the angular resolution of the biaxial compass, compared with a hybrid integration, is improved.

Finally, any misalignment of the patterns with respect to the crystallographic axes of the magnetoresistive material may be compensated for by the offset elimination procedure, greatly reducing the importance of this misalignment by at least one order of magnitude.

The invention therefore makes it possible to produce a set of planar Hall-effect sensors in order to obtain a biaxial compass allowing the direction of the magnetic field to be determined without knowing a priori the sensitivity of the individual elements 1 and 10. The two elements allow two orthogonal components of the magnetic field to be measured. They are produced at the same time on the same substrate. Since they are close to each other, the fabrication Parameters are identical. The two elements have the same sensitivity. To determine the direction of the magnetic field, all that is required is to form the ratio between the two measurements. The result is then independent of the individual sensitivity of the elements. The invention is perfectly well suited to processes for the low-cost high-volume manufacture of compasses on large-area substrates in which very high deposition homogeneity is difficult to achieve. Moreover, the invention requires the introduction of an additional current line in order to place the magnetizaton of the sensitive material of the two sensors in two mutually perpendicular directions. This same current line is used in the invention to eliminate the offset and therefore to obtain better angular resolution.

The invention is also applicable to a triaxial magnetic field direction sensor.

Figure 5:
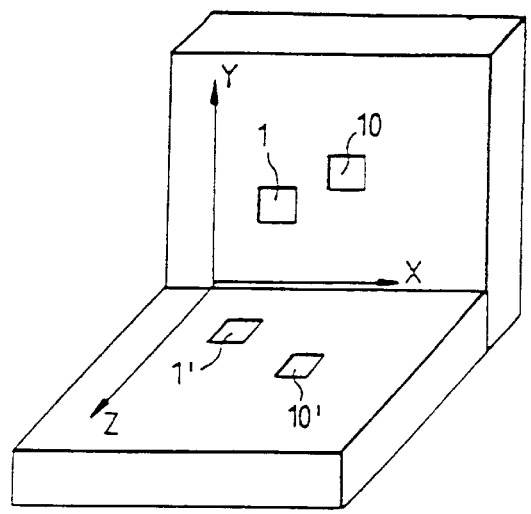
FIG. 5, a triaxial sensor which combines two biaxial sensors according to the invention.

FIG. 5 shows diagrammatically such a sensor.

It comprises, in an XY plane, a first biaxial sensor, as described above, which has two detectors (1, 10) each measuring one component of the magnetic field in one direction (X, Y) in the YX plane. Each detector is shown in this figure by its magnetoresistive sensitive element 1, 10. This first sensor therefore measures the direction of the component of the magnetic field in the XY plane.

A second biaxial sensor, which also has two detectors, (1', 10'), lies in an XZ plane perpendicular to the XY plane. This sensor measures the direction of the magnetic field in the XZ plane. It follows that the set of two sensors makes it possible to determine the direction of the magnetic field in space.

Such a sensor is easier to produce since it merely requires the assembly of two sensors only preferably in perpendicular planes) instead of three sensors in the conventional techniques.

Figure 6A:
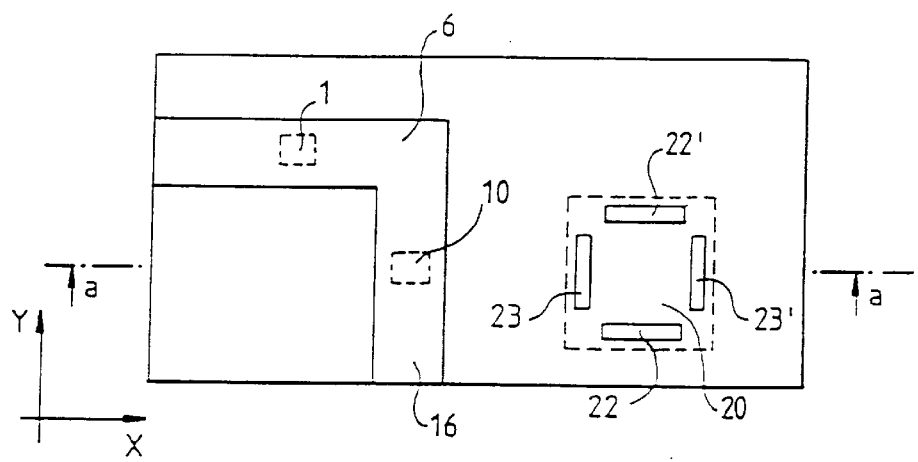
FIGS. 6a and 6b, a triaxial sensor which combines one biaxial sensor and one conventional Hall-effect sensor.
Figure 6B:
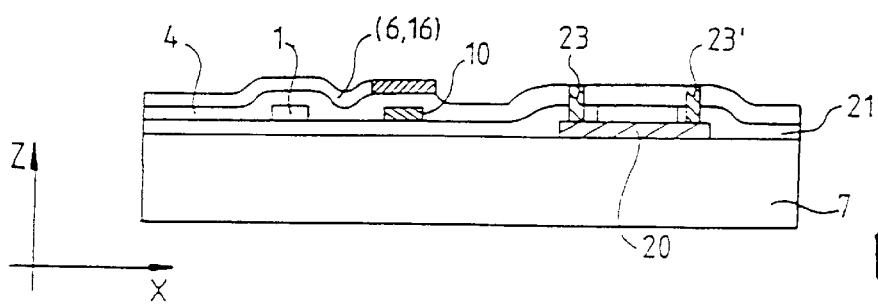

FIGS. 6a and 6b show an alternative embodiment of a triaxial sensor comprising one biaxial sensor, such as that in FIG. 3, and one conventional Hall-effect sensor, both sensors being integrated on the same substrate.

The Hall-effect sensor comprises, on the substrate 7, a layer 20 made of a material having a high electron mobility. This layer 20 is, for example, a layer of a doped semiconductor material. It is covered with an insulating layer 21 on which are produced the magnetoresistive elements 1 and 10 and their connection means, which are not shown in FIG. 6a, 6b. An insulating layer 4 covers at least the elements 1 and 10. Again there is the conductor (6, 16) lying on top of the elements 1 and 10. Finally, connections 22, 22', 23, 23' allow contacting to the Hall-effect element 20. In order to simplify the figures, the contacting to the connections at the elements 1 and 10 has not been shown.

The sensor consisting of the elements 1 and 10 operates as described above and allows the component of the magnetic field in the XY plane to be measured. The conventional Hall-effect sensor comprising the layer 20 allows the component of the magnetic field in the direction of the Z axis to be measured. It follows from this that the set of two sensors allows the direction in space of a magnetic field to be determined.

It should be noted in the above embodiments that switching means may be associated with each conductor 6, 16 in order to allow the direction of flow of the control currents in these conductors to be reversed. Voltage measurement means are associated with each magnetoresistive element and a difference circuit makes it possible to produce the difference between the voltage measurements made in the two directions of flow of the control currents.

In addition, the magnetoresistive elements of the sensors may have the shape of strips supplied with current by a measurement current along the longest Length of the strip. The voltage connection measurements are made at points lying on the lateral edges of each strip. The width of each strip being of the order of a few tens of micrometers to a few hundred micrometers.

What is claimed as new and desired to be secured by Letters Patent of the United States is:

1. Magnetic field sensor comprising a first planar thin-film element having a crystalline magnetoresistive material exhibiting resistivity anisotropy in the plane of said first planar thin-film element, having a first and a second easy axis of magnetizations, said first planar thin-film element having,
    a first pair of electrical connections allowing a first electrical measurement current to flow through the first planar thin-film element in a first direction, and
    a second pair of electrical connections allowing a first voltage to be measured in a second direction transverse to the first direction such that the first and second easy axes of magnetizations have comparable magnetization values; and
    a first electrical conductor parallel to the first easy axis of magnetization, insulated from the magnetoresistive material, and configured to allow a first electrical control current to flow,
    wherein said first electrical control current induces, in the first planar thin-film element, a first magnetic field which imposes, when the magnetic field sensor is not in use, an orientation of a direction of magnetization of the first planar thin-film element parallel to the second easy axis of magnetization.

2. The sensor according to claim 1, wherein said first direction is parallel to at least one of said first and second easy axes of magnetization and said second direction is parallel to the other easy axis of magnetization.

3. The sensor according to claim 2, further comprising:
    a second planar thin-film element having a magnetoresistive material similar to the first planar thin-film element, wherein easy axes of magnetization of the second planar thin-film element are parallel to those of the first planar thin-film element;
    a third pair of electrical connections configured to allow a second electrical measurement current to flow through said second planar thin-film element in a direction parallel to at least one of said first direction and second direction;
    a fourth pair of electrical connections configured to allow a second voltage to be measured in a direction transverse to the direction of flow of the second current and parallel to at least one of the second direction and the first direction; and
    a second electrical conductor parallel to the second easy axis of magnetization and configured to allow a second electrical control current to flow,
    wherein said second electrical control current induces, in the second planar thin-film element, a second magnetic field which imposes, when the magnetic field sensor is not in use, an orientation of the direction of magnetization of the second planar thin-film element parallel to the first easy axis of magnetization.

4. The sensor according to claim 3, wherein for both the first and second planar film elements the first easy axis of magnetization is perpendicular to the second easy axis of magnetization.

5. The sensor according to claim 3, wherein the first planar thin-film element and the second planar thin-film element are made in a same layer of a crystalline magnetoresistive material.

6. The sensor according to claim 5, wherein the first planar thin-film element and the second planar thin-film element are separated by a distance which is as small as a characteristic dimension of said first and second planar thin-film element.

7. The sensor according to claim 6, further comprising on one face of a substrate:
    a Hall-effect sensor made of a material having a high electron mobility configured to allow a magnetic field perpendicular to the face of the substrate to be measured;
    a sensor comprising said first and second planar thin-film elements which are made in the same layer of magnetoresistive material and said first electrical conductor lying on top of the first and second planar thin-film elements and configured to allow said first electrical control current to flow in order to measure one component of a magnetic field in a plane parallel to the face of the substrate.

8. The sensor according to claim 3, further comprising:
    a switching device associated with each of said first and second conductors and configured to allow a direction of flow of the control currents in the first and second conductors to be reversed.

9. The sensor according to claim 8, further comprising:
a voltage measurement device associated with each of said first and second planar thin-film element and
a difference circuit which produces the difference in the voltage measurements made between the reversed directions of flow of the first and second electrical control currents.

10. The sensor according to claim 3, wherein the second electrical measurement current flows in the second planar thin-film element parallel to the first easy axis of magnetization and the second voltage measurement is made in a direction parallel to the second easy axis of magnetization.

11. The sensor according to claim 3, wherein the second electrical measurement current flows in the second planar thin-film element parallel to the second easy axis of magnetization and the second voltage measurement is made in a direction parallel to the first easy axis of magnetization.

12. The sensor according to either of claims 1 and 3, wherein the first and second planar thin-film elements have a shape of strips and are supplied with current by at least one of said first and second electrical measurement currents along the longest length of the strip and the first or second voltage measurements are made at points lying on lateral edges of each strip, the width of each strip being of the order of a few tens of micrometers to a few hundred micrometers.

13. The sensor according to claim 3, wherein the first and second conductors are connected in series and are supplied with a same control current.

14. The sensor according to claim 3, wherein the first and third electrical pairs of connection allow the first and second planar thin-film elements to be supplied in series with a same measurement current.

15. The sensor according to claim 3, further comprising:
a first biaxial sensor including said first and second planar thin-film elements lying in a first plane, said first and second planar thin-film having said first, second, third, and fourth pairs of electrical connections for the flow of said first and second electrical measurement current and for said first and second voltage measurements, with at least one of said first and second conductors parallel to at least one of said first and second easy axis of magnetization;

a second biaxial sensor including a third and fourth planar thin-film elements having a second magnetoresistive material and lying in a second plane approximately perpendicular to the first plane, said third and fourth planar thin-film elements having respective electrical connections for the flow of a third and fourth measurement current and for a third and fourth voltage measurement, as well as at least one of a third and fourth conductor parallel to an easy axis of magnetization of the third and fourth planar thin-film elements.

* * * * *